United States Patent [19]

Maillé et al.

[11] 4,132,999

[45] Jan. 2, 1979

[54] SEMICONDUCTOR DEVICES

[75] Inventors: Jacques H. P. Maillé, Paris; André Salaville, Egly, both of France

[73] Assignee: Societe Anonyme de Telecommunications, Paris, France

[21] Appl. No.: 746,489

[22] Filed: Dec. 1, 1976

[30] Foreign Application Priority Data

Dec. 23, 1975 [FR] France .................. 75 39500

[51] Int. Cl.$^2$ .......................................... H01L 27/14
[52] U.S. Cl. .................................... 357/30; 357/16; 357/52; 357/61; 357/68
[58] Field of Search ............... 357/30, 61, 52, 68, 357/16; 250/211 J

[56] References Cited

U.S. PATENT DOCUMENTS 3,496,024  2/1970  Ruehrwein ................ 357/61 X
3,845,494  10/1974  Ameurlaine et al. ............ 357/30
3,949,223  4/1976  Schmit et al. .................. 357/30

Primary Examiner—Stanley D. Miller, Jr.
Assistant Examiner—James W. Davie
Attorney, Agent, or Firm—Larson, Taylor & Hinds

[57] ABSTRACT

A semiconductor device comprises a substrate made of an alloy having the formula $Cd_xHg_{1-x}Te$ where x is a non-zero number less than 1. The substrate has P type conductivity and a doping agent such as mercury is diffused into the substrate to form a region of N type conductivity therein. Before diffusion of the mercury into the substrate, a protective layer of cadmium telluride CdTe is applied to the surface of the substrate and the doping agent is diffused into the substrate through the protective layer. The device finds application as a photovoltaic detector of infrared radiation.

12 Claims, 8 Drawing Figures

SEMICONDUCTOR DEVICES

BACKGROUND OF THE INVENTION

The invention relates to a semiconductor device of the planar kind comprising a substrate made of a semiconductor material having a first kind of conductivity, in which a region having a second type of conductivity is formed and constitutes a PN junction with the first-type region. The invention also relates to a method of constructing such a device. More particularly, the invention relates to a device of the kind in question intended inter alia for forming a photovoltaic detector, in which the substrate is made of an alloy of two materials, having different forbidden band widths (or forbidden energy gaps), the width of the forbidden band of the alloy being dependent on the relative proportions of the two materials in the alloy, the two materials preferably being cadmium telluride and mercury telluride. Finally, the invention relates to a method of constructing a photovoltaic detector in which the substrate is a semiconductor material having the formula $Cd_xHg_{1-x}Te$, x being a non-zero number less than 1.

Photovoltaic detectors comprising a substrate based on an alloy having the formula $Cd_xHg_{1-x}Te$ are of use inter alia in detecting infrared radiation. They are generally made from a P type substrate into the surface of which an impurity such as mercury is diffused, so as to produce a type N surface region of the substrate and thus form a PN junction. The sensitive surface of a detector of this kind is the surface of the substrate into which the impurity has been diffused. A method of constructing such a detector is described e.g. in French Pat. No. 1,504,497 filed on May 27, 1966 by the CNRS.

In most applications of photovoltaic detectors, more particularly in the infrared, it is important for the sensitivity to be high. French Patent Application No. 74 27 282 filed on Aug. 6, 1974 describes a method for improving the sensitivity of such detectors.

The method has been used to obtain a detector of the aforementioned kind comprising an adaptation layer whereby the electric and mechanical characteristics of the photovoltaic detector can be improved.

An object of the invention is to provide a photovoltaic detector having even greater sensitivity to radiation.

Another object of the invention is to construct the detector in a simple, economic manner.

SUMMARY OF THE INVENTION

A semiconductor device according to the invention comprises a semiconductor substrate having a first type of conductivity and a region having the second type of conductivity over at least part of the outer surface of the substrate, the region forming a PN junction with the first-type region and being doped with a doping agent having a high diffusion coefficient in the substrate. The device is characterised in that the outer surface, over at least a considerable part of the region having the second type of conductivity, is covered with a surface layer made of a material which, under normal operating and storage conditions of the semiconductor device, has considerably lower permeability to the doping agent than its permeability to the doping agent under the operating conditions of at least one method of diffusing the doping agent in the substrate.

The semiconductor device is constructed as follows. Firstly, according to the invention, the surface layer is deposited on the outer surface of the substrate; next, a doping agent having a high diffusion coefficient in the substrate having the first type of conductivity is diffused through the surface layer in order to produce a region having the second type of conductivity. Thus the surface (which forms the sensitive surface in the case where the semiconductor device is a photovoltaic detector) is protected both during the diffusion of the doping agent and during use of the semiconductor device.

According to one feature, the invention relates to a semiconductor device such as a photovoltaic detector comprising: a substrate having a first type of conductivity formed of an alloy of two constituents having different forbidden band widths, the width of the forbidden band of the alloy being dependent on the relative proportion of the two constituents in the alloy; and a region in said substrate at the outer surface thereof, said region having a second type of conductivity. The device is characterised in that, over at least a considerable part of the region having the second type of conductivity on the surface, it comprises a surface layer made of a material consisting mainly of that one of the two alloy constituents which has the larger forbidden band width. The surface layer thus forms a protective layer which is transparent to radiation and wavelengths corresponding to the operating range of the photodetector.

More particularly, in its preferred application, the invention relates to a semiconductor device comprising a substrate having a first type of conductivity and made of an alloy having the formula $Cd_xHg_{1-x}Te$, x being a non-zero number less than 1, the device comprising a region having the second type of conductivity in the substrate, at least over part of its outer surface, and forming a PN junction with the first-type region. The device is characterised in that, over at least a considerable part of the region on the surface, it comprises a surface layer made of a material consisting mainly of cadmium telluride CdTe. This material (CdTe) adheres in satisfactory manner to the substrate; it protects the surface of the device during manufacture and operation; finally, when the device is a photovoltaic detector sensitive to infrared radiation having a wavelength of the order of $10\mu$ (x being of the order of 0.4), the surface CdTe layer does not affect the performance of the detector, since it is transparent to radiation up to a wavelength of $15\mu$. In the case where the substrate is P-type, the region is N type and is preferably doped with a doping agent such as mercury or indium.

According to another feature, the invention relates to a method of constructing a photovoltaic detector comprising a substrate having a first type of conductivity and made of an alloy having the formula $Cd_xHg_{1-x}Te$, x being a non-zero number less than 1, wherein a region having the second type of conductivity is formed by diffusing a doping agent having a high diffusion coefficient in the substrate, at least in a part of an outer surface of the substrate forming a sensitive surface, so as to produce a PN junction with the first-type region. This method is characterised in that a thin protective layer of cadmium telluride CdTe is deposited on the sensitive surface and in that the doping agent is diffused through the protective layer. A photovoltaic detector constructed in this way has much greater sensitivity than previously-known detectors of the same kind.

BRIEF DESCRIPTION OF THE DRAWINGS

Other objects, advantages and features of the invention will be clear from the following description of two embodiments, given with reference to the accompanying drawings, in which.

DESCRIPTION OF PREFERRED EMBODIMENTS

The example which will now be described with reference to FIGS. 1-7 relates to a photovoltaic detector having a substrate consisting of an alloy having the formula $Cd_xHg_{1-x}Te$. In this formula, x is a non-zero number smaller than 1 and preferably less than 0.4.

Figure 1:
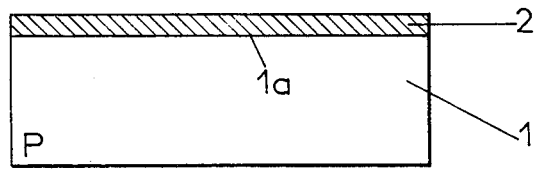
FIGS. 1 through 7 diagrammatically illustrate the various steps in the construction of a photovoltaic detector according to the invention.

As shown in FIG. 1, substrate 1 is P-type. A transition layer 2 of the kind described in the aforementioned French Patent Application No. 74 27 282 is deposited on the main surface 1a of the substrate. Layer 2 is a layer of cadmium telluride CdTe which is deposited by any known method such as cathodic atomization or evaporation in vacuo. As likewise described in the aforementioned French Patent Specification, a masking layer 3 (FIG. 2) is deposited on layer 2. The masking layer is made of an insulating material which does not react with the constituents and doping agents in the device. In the example, the material is zinc sulphide ZnS. Alternatively, layer 3 can be made of silicon dioxide $SiO_2$, silicon monoxide SiO, or silicon nitride $Si_3N_4$.

Figure 2:
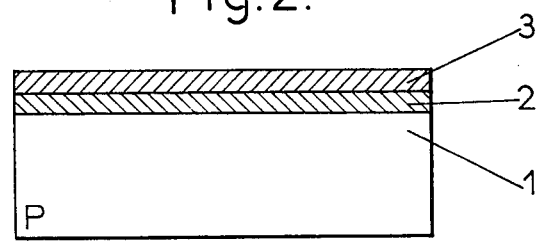
Figure 3:
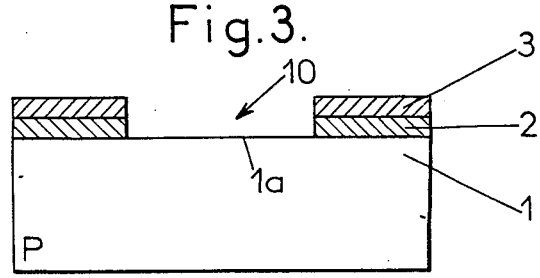
Figure 4:
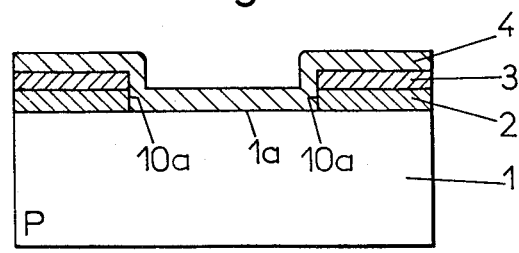

Next, the element shown in FIG. 2 is heat-treated at a temperature between 200° C. and 400° C., for at least 1 hour at 400° C. and 15 hours at 200° C. The heat-treatment is to produce a layer 2 having a gradually varying composition. As described in French Patent Application No. 74 27 282, the heat-treatment results in recrystallization of layer 2 and also yields a layer having a composition which varies continuously between the composition of the substrate and that of the masking layer. Near substrate 1, the composition of layer 2 is substantially the same as that of the substrate, whereas near the interface with the masking layer, the layer is made of pure cadmium telluride.

After the heat-treatment, at least one aperture or "window" 10 (FIG. 3) is made in layers 2 and 3, so as to expose part of the surface 1a of substrate 1. A doping impurity is diffused through the aperture so as to dope substrate 1 over part of surface 1a and form a PN junction.

According to the invention, a layer 4 (FIG. 4) of cadmium telluride is deposited at least in aperture 10. In the example illustrated in FIGS. 1-7, layer 4 also covers the masking layer 3. Layer 4 can be deposited by any known method such as evaporation in vacuo or cathodic atomization. Layer 4, which will hereinafter be called the "protective layer", adheres in satisfactory manner to the surface 1a of substrate 1 and to the edges 10a of aperture 10.

The protective layer 4 fulfils various functions. Firstly, as will be seen hereinafter in connection with FIG. 5, layer 4 in aperture 10 protects surface 1a of substrate 1 when mercury is diffused in the substrate to form an N-type region. The layer does not prevent diffusion, since experiments carried out as part of the invention have shown that the diffusion coefficient of mercury through the CdTe layer 4 is sufficiently high, during doping of the substrate by mercury, for the layer not to interfere with doping, provided the layer is not too thick. The preferred method of doping is diffusion of mercury at elevated temperature, preferably above 300° C. At lower temperatures, inter alia at ambient temperature under normal operating and storage conditions, the layer of cadmium telluride is practically impermeable to mercury.

This property of protecting surface 1a during diffusion of mercury in substrate 1 is particularly important. The inventors have found that, when mercury is directly diffused over the free surface of the substrate, it produces a deterioration of the surface. The deterioration of the surface (which is the sensitive surface of the photovoltaic detector) has a number of disadvantages; more particularly it results in surface recombination currents which reduce the inverse impedance of the resulting photodiode. In addition, the poor surface results in considerable optical absorption and thus reduces the sensitivity of the detector, inter alia its quantum yield (i.e. the ratio of the number of electric charges produced by radiation to the number of photons supplied by the radiation). Finally, the photodiode has a relatively low breakdown voltage. If a layer 4 is deposited on the substrate before diffusion of mercury, surface 1a is protected and remains undamaged, so that the detector has considerably improved sensitivity.

In addition, the CdTe layer 4 is transparent to infrared radiation up to a wavelength of the order of 15 microns.

The inventors have also found that, at the surface, the mercury has no action on cadmium telluride. Accordingly, the state of the outer surface of layer 4 remains satisfactory, the optical absorption of incident radiation is low, and the detector has a high quantum yield.

Layer 4 also protects surface 1a and the junction during a subsequent metallization operation, which will be described hereinafter with reference to FIG. 7. Finally, as a result of layer 4, the junction can be produced at a low level in the substrate and the mercury can be diffused more slowly than in the absence of layer 4. Consequently, manufacture of the junction can be more easily controlled.

Figure 5:
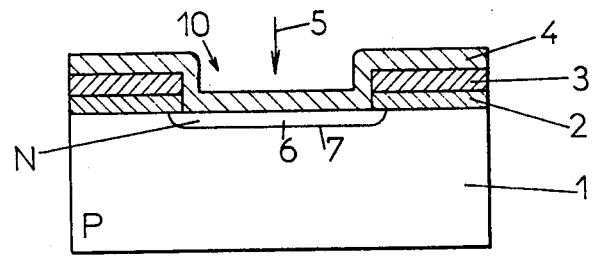

As shown in FIG. 5, after the CdTe layer 4 has been produced the mercury (indicated by arrow 5 in FIG. 5) is diffused in aperture 10 through layer 4. As already stated above, this diffusion stage is carried out at a high temperature, of at least 300° C. The diffusion is carried out in a sealed glass bulb (not shown) in the presence of mercury in the liquid phase (deposited on the outer surface of layer 4) or in the gaseous phase, by heating the bulb to 300° C. for about half an hour.

After the mercury diffusion stage, an N-type region 6 exists in the substrate and extends over a larger area than aperture 10. The N-type region 6 forms a PN junction 7 with the P-type substrate.

Figure 6:
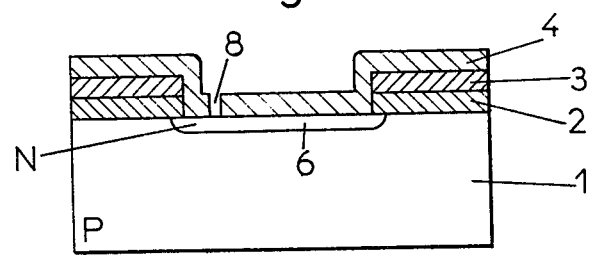

As shown in FIG. 6, the production of region 6 is followed by the formation of at least one aperture 8 in layer 4 above region 6 for the output electrical contacts of the photovoltaic detector. Aperture 8 is made e.g. by chemical erosion of layer 4 by a very dilute solution of bromine and ethanol. The solution erodes the CdTe layer 4 at a predetermined speed; consequently the erosion time can be limited so that only the required portion of layer 4 is removed and layer 6 is left intact.

Figure 7:
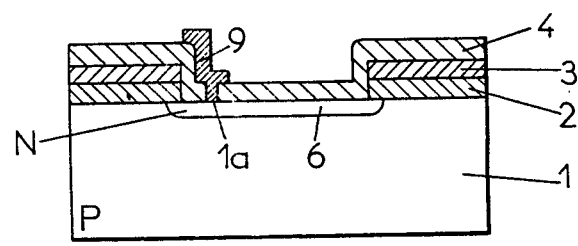

The last operation, shown in FIG. 7, consists in filling the aperture (or apertures) 8 with a metal such as chromium or gold, thus obtaining a metal contact 9 which adheres to a part of surface 1a which constitutes a boundary of the N-type region 6. The metal contact 9 extends above layer 4 in order to provide the necessary electric contact or terminal portion for connection to an electrical measuring circuit containing the photovoltaic detector.

Note that, as a result of layer 4, it may be unnecessary to deposit an additional protective layer, e.g. of zinc sulphide, which is normally necessary when similar contacts are made without providing a cadmium telluride layer 4. During metallization, layer 4 protects both surface 1a and the edges of the junction, since layer 4, like layers 2 and 3, covers the edges of the junction, which is therefore not disturbed after its production.

In a particular embodiment of a detector of the kind described, use was made of a wafer of a $Cd_xHg_{1-x}Te$ alloy in which $x = 0.2$, the surface of the wafer being of the order of 300 mm$^2$ and having a concentration of doping impurity atoms of $10^{17}$ atoms/cm$^3$. Next, a CdTe layer 2 having a thickness of 3,000 Å was deposited, followed by a zinc sulphide ZnS masking layer 3 likewise having a thickness of 3,000 Å. About 3,000 apertures 10 were formed in the wafer, each aperture having an area of $10^{-2}$ mm$^2$ (100$\mu$ × 100$\mu$). Finally, a CdTe layer 4 having a thickness of 3,000 Å was formed and mercury was diffused for about half an hour. Under these conditions, the N-type region 6 had a carrier concentration of $10^{16}$ atoms/cm$^3$. The resulting detector was found to have a quantum yield of the order of 50% whereas the corresponding yield was of the order of 25% when there was no CdTe layer 4.

Figure 8:
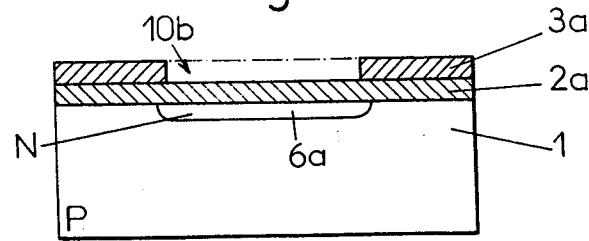
FIG. 8 shows another embodiment of the detector according to the invention.

FIG. 8 shows a variant of the method according to the invention. In this variant, the CdTe layer 2a is first formed on the free surface 1a of P-type substrate 1. Next, a ZnS masking layer 3a is deposited on layer 2a. An aperture 10b is formed in layer 3a, leaving layer 2a intact. Finally, mercury is diffused into substrate 1 through layer 2a so as to form an N-type region 6a. This method is simpler than the process described previously in connection with FIGS. 1-7. However lateral diffusion, which may cause difficulty, is not eliminated in such a satisfactory manner as when a layer 4 is provided and covers layer 3 in addition to the surface 1a above the region 6 to be formed.

The device and the method described in relation to FIGS. 1-8 can be varied in numerous ways. For example, the doping agent may be indium instead of mercury.

Preferably the thickness of layer 4 (or 2a) is between 500 and 5,000 Å.

As already stated, the device and the method according to the invention have numerous advantages. In addition to those already mentioned, inter alia protection of the device during the various steps in its manufacture, layer 4 (or 2a) can be used to reduce the number of operations required for manufacturing the detector.

Clearly, as the preceding shows, the invention is in no way limited to those applications and embodiments which have been described in detail, but includes all variants. More particularly, although the heat treatment in the first embodiment was carried out before aperture 10 and layer 4 were formed, it could be performed after the formation of layer 4 and before the diffusion of the doping agent.

We claim:

1. A semiconductor device comprising:
    a substrate having an outer surface and made of a semiconductor material having a first type of conductivity;
    a region in said substrate at said outer surface of said substrate having a second type of conductivity, said region being doped with a doping agent to form a PN junction with said material of said first type of conductivity; and
    a layer on said outer surface of said substrate covering at least a major part of said region of said second type of conductivity, said layer being made of a material having a permeability to said doping agent under normal operating and storage conditions of the semiconductor device which is significantly lower than its permeability to said doping agent under the operating conditions of at least one method of diffusing said doping agent onto said substrate, said layer at least principally consisting of cadmium telluride.

2. A semiconductor device comprising:
    a substrate made of a material having a first type of conductivity, said substrate having an outer surface and being made of an alloy having the formula $Cd_xHg_{1-x}Te$, where x is a non-zero number less than 1;
    and
    a region in said substrate at said outer surface of said substrate, said region having a second type of conductivity and forming a junction with said material of said first type of conductivity;
    said device further including
    a layer on said outer surface of said substrate covering at least a major part of said region of said second type of conductivity, said layer consisting at least mainly of cadmium telluride and said device further including an electrical contact which extends above said layer.

3. A semiconductor device as claimed in claim 2, wherein said substrate has type P conductivity and said region has type N conductivity, said region being doped with a doping agent.

4. A semiconductor device as claimed in claim 3, wherein said doping agent is mercury.

5. A semiconductor device as claimed in claim 3, wherein said doping agent is indium.

6. A semiconductor device as claimed in claim 2, wherein apertures are formed in said surface layer over said region having said second type of conductivity, metal being deposited in said apertures and extending above said layer to form said electrical contact.

7. A semiconductor device as claimed in claim 2, wherein said layer has a thickness between 500 and 5,000 Å.

8. A semiconductor device as claimed in claim 2, said device further comprising a portion of said outer surface of said substrate having said first type of conductivity, and a second layer on said surface portion, said second layer consisting at least mainly of cadmium telluride.

9. A semiconductor device as claimed in claim 8, further comprising a masking layer of insulating material over said second layer.

10. A semiconductor device as claimed in claim 8, wherein said second layer covers part of said junction which is level with said outer surface of said substrate.

11. A semiconductor device as claimed in claim 8, wherein said layer and said second layer form a single layer on said outer surface of said substrate.

12. A semiconductor device comprising:

a substrate made of a material having a first type of conductivity, said substrate having an outer surface and being made of an alloy of a first constituent having a first forbidden band width and a second constituent having a second forbidden band width greater than said first forbidden band width, the width of the forbidden band of said alloy being dependent on the relative proportions of said first and second constituents in said alloy; and a region in said substrate at said outer surface of said substrate, said region having a second type of conductivity and forming a junction with said material of said first type of conductivity;

said device including a layer on said outer surface of said substrate covering at least a major part of said region of said second type of conductivity, said layer consisting at least mainly of said second constituent of said alloy and a metallic electrical contact which extends through said layer to make contact with said outer surface of said substrate and which includes a terminal portion which extends above said layer.

* * * * *